United States Patent [19]

Welzhofer

[11] 4,399,405

[45] Aug. 16, 1983

[54] TEST FACILITY

[75] Inventor: Klaus Welzhofer, Graefelfing, Fed. Rep. of Germany

[73] Assignee: Siemens Aktiengesellschaft, Berlin & Munich, Fed. Rep. of Germany

[21] Appl. No.: 215,086

[22] Filed: Dec. 10, 1980

[30] Foreign Application Priority Data

Dec. 21, 1979 [DE] Fed. Rep. of Germany ....... 2951929

[51] Int. Cl.³ .......................................... G01R 15/12
[52] U.S. Cl. ............................. 324/73 AT; 324/73 R; 364/579
[58] Field of Search ............. 364/579, 580; 324/73 R, 324/73 AT; 371/20, 21

[56] References Cited

U.S. PATENT DOCUMENTS 3,631,229 12/1971 Bens .................................. 324/73 R
4,161,029 7/1979 Frye .................................. 324/73 R
4,211,915 7/1980 Miller ................................ 324/73 R

FOREIGN PATENT DOCUMENTS 2233612 1/1974 Fed. Rep. of Germany .

Primary Examiner—Michael J. Tokar
Attorney, Agent, or Firm—Hill, Van Santen, Steadman, Chiara & Simpson

[57] ABSTRACT

A test facility comprises a transmitter and a receiver for an automatic test system for function testing of integrated circuits of different technologies, whereby the input and output of the test specimen are connected to the same test pin. In order to test circuits of different technological format, it is necessary to pre-program the output of the test facility to the respective characteristic level of the different circuit families. To this end, a transmitter contains a constant current source keyed by the inverted input signal with a TTL level related to zero volts, the constant current source being connected at its output to the input of an output stage provided with a dynamically variable constant current load. The input of the output stage is connected to the output of a programming circuit which, depending on the TTL levels applied to its two inputs, switches different resistors in circuit whose voltage drop influences the output level of the constant current source in such a manner that the output stage, due to different drive, exhibits the output level required for testing components having different technological formats. The transmitter stage is connected by way of a bidirectional line both to the input of a receiver including a comparison circuit and a memory post-connected thereto, and to the respective test pin. The invention is particularly suited for employment in automatic testing units for data processing devices.

21 Claims, 2 Drawing Figures

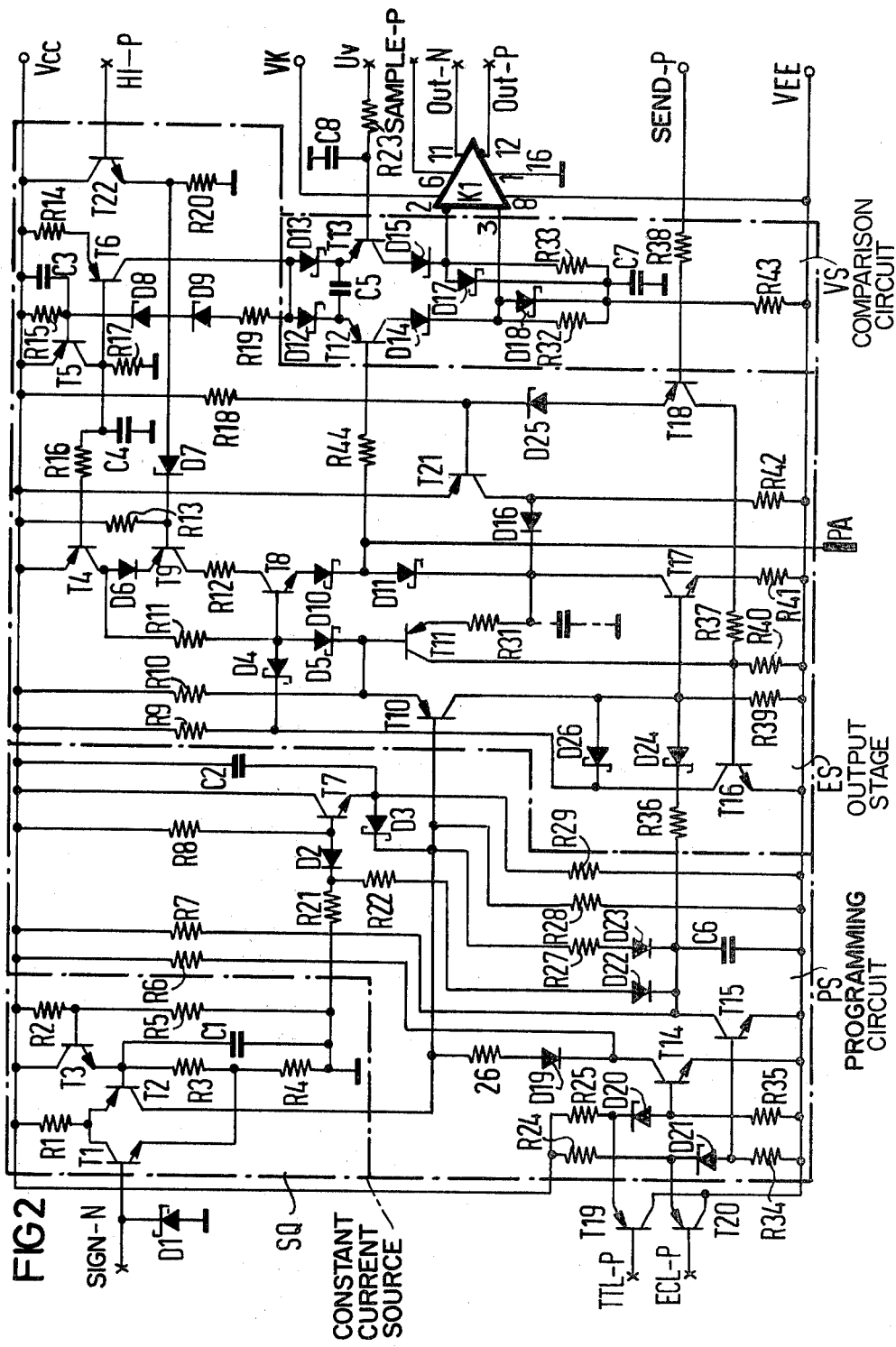

TEST FACILITY

BACKGROUND OF THE INVENTION

1. Field of the Invention

The present invention relates to a test facility comprising a transmitter and a receiver for an automatic testing system for function testing of integrated circuits of differing technologies, whereby the input and output of the test specimen are connected to the same testing pin.

2. Description of the Prior Art

Every test system must inherently generate the static and dynamic levels required for the test and offer the same to the test specimen. If, however, a test system is to be flexible, then it must generate as many levels as possible in order to be able to therewith simultaneously drive various circuit families. Hitherto, this was achieved in that the corresponding gate modules from the logic families to be tested are built up on a "connection component" and are respectively connected by relays. These modules are not short-circuit proof, which often leads to failures given the defective test specimens.

SUMMARY OF THE INVENTION

The object of the present invention is to provide a test facility which can be pre-programmed for testing circuits of different technological format at the respectively required levels.

A further object is to provide for the prevention of destruction of the test facility due to defects in the test specimen.

In order to achieve the foregoing objects, the test facility of the present invention is designed in such a manner that the transmitter contains a constant current source keyed by the inverted input signal with a transistor-transistor-logic (TTL) level related to zero volts, the constant current source being connected at its output to the input of an output stage provided with a dynamically variable constant current load. The input of the output stage, moreover, is connected to the output of a programming circuit which switches variable resistors in circuit as a function of the TTL levels applied to its two inputs, the voltage drop of the resistors influencing the output level of the constant current source in such a manner that the output stage exhibits the output levels required for testing components having differing technological format by a varying control. The transmitter output stage is connected both to the input of a receiver comprising a comparison circuit and a memory connected thereto, and to the respective test pin via a bi-directional line.

By means of the foregoing structure, one obtains a test facility in which the driveability of the circuit families of different technological format is possible with the same test facility, whereby an increase of the test accuracy is achieved.

The constant current source, thereby, can comprise a first transistor in an emitter circuit and a second transistor in a base circuit post-connected thereto.

By the constant current source, the TTL input level related to zero volts is reshaped to a current shift of defined magnitude which suffices for the drive of the output stage of the transmitter.

The output stage comprises a third transistor and a fourth transistor which are connected as emitter followers and in whose output circuit a transistor driven dependent on the output level which functions as a dynamically variable load is connected, whereby the base of this fifth transistor is connected to the point of junction of the collector of the third transistor and its collector resistor.

By so doing, one obtains an output stage which can be operated in four-quadrant operation, i.e. it can both emit power and receive power within specific limit without the constancy of the output level being thereby essentially changed.

The test facility, moreover, can be designed in such a manner that the programming circuit exhibits a sixth transistor and a seventh transistor which, on their collector sides, are respectively connected to the input of the output stage and the output of the constant current source via a first or, respectively, second series connection comprising a first diode and a first ohmic resistor or, respectively, a second diode and a second ohmic resistor and, at their emitter sides, are connected to a supply voltage source of one polarity. Parallel to the series connection and to the sixth and seventh transistors, a third ohmic resistor is connected which is dimensioned in such a manner that the emitter-coupled logic (ECL) "log 1" level lies at the output of the output stage in a blocked state of the sixth and seventh transistors. An eighth transistor is connected by way of a third Zener diode on the emitter side to the input of the output stage and to the output of the constant current source and is connected, on its collector side, to a supply voltage source of the other polarity. The bases of the sixth and seventh transistors are driveable via fourth and fifth Zener diodes with a TTL logic level. The base of the transistor is connected to a third voltage divider having two resistors which lie between the supply voltage source with the other polarity and in ground. The fourth series connection of a fourth ohmic resistor and of a sixth diode is arranged between the tap of the third voltage divider and the collector of the seventh transistor. The voltage divider resistors of the first and second series connections are dimensioned in such a manner that, given a blocked state, the TTL "log 1" level or, respectively, metal-oxide-semiconductor (MOS) "log 1" level of the sixth or, respectively, the seventh transistor respectively appears at the output of the output stage.

By so doing, the generation of the desired output levels is made possible in a more simple manner.

The inputs of the programming circuit can be driven by way of a ninth or a tenth transistor in collector circuit configuration at whose inputs the TTL logic levels required for the programming can be respectively applied. By so doing, one obtains a nonreactive drive.

A seventh diode can be arranged between the two voltage divider resistors of the third voltage divider for compensation of the effect of temperature at the base-emitter portion.

In order to reduce the base drive of the fifth transistor given the desired ECL output level, it is advantageous that the base of the fifth transistor of the output stage operating as a dynamic load resistor be connected by way of a fifth ohmic resistor and a eighth diode to the collector of the seventh transistor of the programming circuit.

If one designs the test facility in such a manner that a ninth Zener diode and a tenth Zener diode, at whose point of junction the output voltage is tapped, lie between the fourth transistor of the output stage and the fifth transistor connected as a dynamic load resistor, then one achieves a protection given positive overvoltages with outputside feed for the fourth transistor.

Exceeding the admissible leakage power of the fifth transistor given feed of opposite overvoltage at the output is avoided in that the third transistor and fourth transistor are connected to one another by way of an eleventh Zener diode. The output electrode of the third transistor is connected to the base of an additional eleventh transistor whose collector is connected via a sixth ohmic resistor to the supply voltage of the one polarity and whose emitter is connected via a seventh ohmic resistor to the collector of the fifth transistor. The base of a twelfth transistor whose emitter and collector respectively lie at the supply voltages of different polarities is connected to the collector of the seventh transistor. The collector of a twelfth transistor, moreover, is connected via a twelfth Zener diode to the base of the fourth transistor.

Blocking the output stage semiconductors is achieved in that the collector of a thirteenth transistor is connected by way of an eighth ohmic resistor to the base of the twelfth transistor. The base of the thirteenth transistor can be charged as the third programming input (send P) with a static TTL level. The collectors of the twelfth transistor and of the thirteenth transistor are connected to one another by way of a thirteenth Zener diode.

The comparison circuit of the receiver is a differential amplifier circuit comprising a fourteenth transistor and a fifteenth transistor, the output of the transmitter lying at one input of the differential amplifier circuit and the comparison voltage lying at the other input of the differential amplifier circuit. If one connects Schottky diodes parallel to the collector resistors of the fourteenth and fifteenth transistors, then the current amplitude is thereby limited. This has the advantage that, given collector resistors that are dimensioned sufficiently high-resistant, the gain is great and the so-called Miller effect can nonetheless be kept small.

It is advantageous for setting the DC operating point for the memory module that the collector resistors of the fourteenth and fifteenth transistors are connected to the supply voltage of the one polarity by way of a common resistor. In order to protect the inputs of the memory from overvoltage, the nineteenth and twentieth Zener diodes are connected in series to the collector resistors of the fourteenth and fifteenth transistors.

The fourteenth and fifteenth diodes connected at the emitter branches of the fourteenth and fifteenth transistors of the comparison circuit prevent a destruction of the fourteenth and fifteenth transistors of the comparison circuit given puncture of the base-emitter path of these transistors in the blocking direction.

The memory of the receiver can advantageously comprise a clock-controlled D flip-flop to which a logical ECL level can be supplied as the sampling voltage.

Given extremely negative overvoltages at the output of the transmitter, the fourth transistor can be protected in that the emitters of the fourteenth and fifteenth transistors are connected by way of a ninth resistor to a sixteenth Zener diode and a seventeenth Zener diode and to a tenth ohmic resistor.

If one places a sixteenth transistor whose base is connected to the tap of the fourth voltage divider parallel to the elements in the common emitter circuit of the fourteenth and fifteenth transistors, then one obtains a constant current source for a comparison circuit, whereby, a large synchronism range is achieved. In order to compensate the effect of temperature of the base-emitter path of the sixteenth transistor, it is advantageous that the collector-emitter path of a seventeenth transistor which is conductive in the normal operating state is connected in the collector circuit of the fourth transistor, the base of the seventeenth transistor being connected to ground via the fourth voltage divider. The collector-emitter path of an eighteenth transistor is connected between the tap of the fourth voltage divider and the supply voltage source of the other polarity, the base of the eighteenth transistor being connected to the point of junction of the tenth ohmic resistor with the sixteenth Zener diode.

One obtains protection of the fourth transistor against over current when an eleventh ohmic resistor is connected between the collector of the fourth transistor of the output stage and the collector of the seventh transistor.

In order to make the inset point of the current limitation switchable given non-terminated lines, the test facility can also be designed in such a manner that the collector-emitter path of a nineteenth transistor lies between the eleventh ohmic resistor and the collector of the seventeenth transistor, the base of the nineteenth transistor being driven via an eighteenth Zener diode and the emitter of a twelfth transistor whose base forms a fourth programming input at which the logical TTL level can likewise be applied.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 2 is a schematic circuit diagram of an exemplary embodiment of the invention.

DESCRIPTION OF THE PREFERRED EMBODIMENTS

Figure 1:
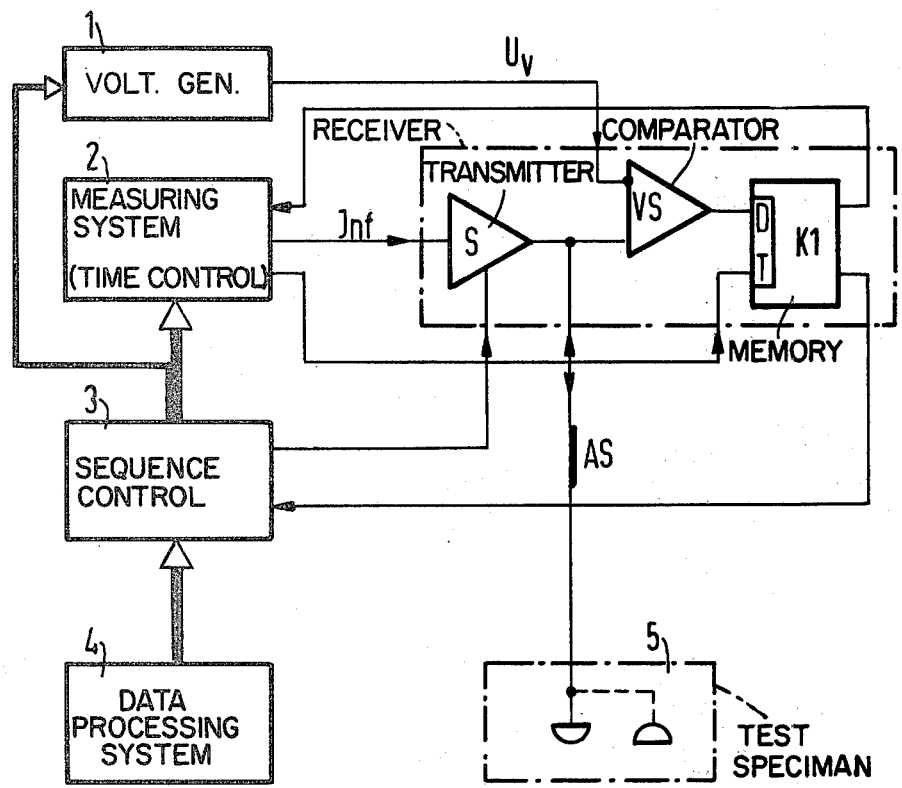
FIG. 1 is a block diagram illustration of a testing facility constructed in accordance with the present invention.

Referring to FIG. 1, an automatic testing unit is disclosed which employs a testing facility constructed in accordance with the present invention. In the testing facility, a transmitter S is provided, as well as a receiver (within broken lines) which comprises a comparison circuit VS and a memory K1. A bidirectional line is connected to the output of the transmitter S which is at the same time the input of the receiver, the bidirectional line extending to a test pin of the respective test specimen 5 in the automatic testing unit. A data processing system 4 influences a sequence control 3 and this, in turn, influences both the time control and measuring system 2 and a voltage generator 1. The voltage generator 1 supplies the comparison voltage UV for the comparison circuit VS. One input of the memory, moreover, is connected to a time control and measuring system 2 and causes the corresponding start and the subsequent stop in every measurement. At the second output of the memory, a reference/actual comparison value is simultaneously applied to the sequence control, whereby the sequence control is stopped when the reference/actual comparison reveals that a defect exists in the test specimen. At the same time, the sequence control also undertakes the programming of the transmitter for the respectively desired operating mode or, respectively, the desired output level. The sequence control, in turn, receives the input signal of the transmitter from the time control and measuring system.

A detailed circuit diagram of the measuring device is illustrated in FIG. 2.

The transmitter essentially represents a pulse shaper, i.e. the TTL signal incoming via the input SIGN-N is through-connected to the output (automatic unit pin) without chronological change but, however, respectively modifiable in amplitude values (corresponding to ECL, TTL and MOS) due to the programming inputs TTL-P or, respectively, ECL-P.

The transistor T1 operates as an intermittent constant current source. Its task is to reshape the zero voltage-related TTL input level into a current shift of defined magnitude that a sufficiently great voltage drop is subtracted at a resistor R1 from the voltage Vcc so that a transistor T2 is certain to block, given drive of the base of the transistor T1 with TTL-"1" (+3.5 V). There thus applies (disregarding the current through a resistor R3) for the collector current of the transistor T1:

$$I_c T_1 = \frac{/TTL - "1"/ - /U_{BE} T_1/}{R_4}\left(1 - \frac{1}{B_T 1}\right)$$

$B_T 1$ = Current gain of $T_1$

The voltage:

$$U_E T_2 = V_{cc} - (I_c T_1 \cdot R_1)$$

then lies at the emitter of the transistor T1. The transistor T2 operates in a base circuit configuration; together with the resistor R1 it forms a constant current source controlled at the emitter. This offers the advantage that one can make due with small control voltage shifts whereby the parasitic transistor capacitances $C_{CBO} T_1$, $C_{CE} T_1$ or, respectively, $C_{CBO} T_2$ need not be so greatly reversed and, moreover, the parasitic negative feedback across the collector-base capacitance of the transistor T2 (Miller effect) remains largely ineffective due to the low-resistance operating point at the base of the transistor T2, leading to more rapid switching behavior.

On the one hand, the transistor T3 operates as a constant voltage source in that it forms the base bias voltage for the transistor T2 and, on the other hand, the $U_{BE}$ of the transistor T3 opposes the effective temperature of the $U_{BE}$ of the transistor T2 by way of compensation.

In order that the emitter of the transistor T1 is connected to the voltage divider center point R3/R4, a digital switching threshold occurs for the input signal at the base of the transistor T1, the digital switching threshold lying at half the input TTL level ( $\triangleq$ +1.5 V) due to corresponding dimensioning of the resistor R3 and the resistor R4.

The Schottky diode D1 functions as a line termination in that it short circuits negative overshoots of the input pulse to zero volts.

As already mentioned, the transistor stage T2 likewise forms an intermittent constant current source whose collector current $$I_c T_2 = \frac{/U_{CE} T_3/ - /U_{BE} T_2/}{R_1}\left(1 - \frac{1}{B_T 2}\right)$$

$B_T 2$ = Gain of $T_2$ as a function of the static logic level at the programming inputs TTL-P or, respectively, ECL-P, goes through one of the resistors R26 or R27 thereby connected by way of a transistor T14 or a transistor T15 and through a resistor R28.

The amplitude corner values for the respective logic "1" level of the output pulse are thereby formed.

Let it be assumed that both programming inputs TTL-P and ECL-P carry the TTL logic level "0" (=+0.4 V), then the two Zener diodes D20 and D21 are blocked. This causes the bases of the transistors T14 and T15 to lie at the emitter potential by way of a resistor R35 or, respectively, the resistor R34, for which reason the transistor T14 and the transistor T15 are blocked. In this case, the collector current of the transistor T2 flows completely off toward VEE through the resistor R28. The voltage at the base of the transistor T10 accordingly is:

$$U_B T_{10} = V_{EE} + /I_C T_2/ \cdot R_{28}$$

As the output, this voltage forms the logic "1" for the MOS level (=most positive output value).

If, for example, the static logic "0" level at the programming input TTL-P changes to a logic "1" ( $\triangleq$ +3.5 V), then the Zener diode D20 triggers and the current $$I_B T_{14} = \frac{/V_{EE} + V_{cc} - U_{BE} T_{14} - U_Z D_{20}/}{R_{25}}$$

flows into the base of the transistor T14.

The transistor T14 and the diode D19 are thus conductive and the voltage:

$$U_B T_{10} = V_{EE} + R_{28} \frac{/I_c T_2 \cdot R_{26} + U_D 19 + U_{CE} T_{14}/}{R_{26} + R_{28}}$$

is now formed at the base of the transistor T10. At the output, this voltage defines the logic level "1" for TTL.

If, on the other hand, the input ECL-P is activated by the application of a static TTL logic "1", then the Zener diode D21 triggers and the operation described above is repeated via the components T15, T23 and R27. Therefore, the logic "1" level for ECL is at the output. The components D2 and T7 form a constant voltage source (emitter follower transistor T7) which can be reprogrammed by means of a transistor T15 via a voltage divider R8, R21 and R22. Thereby, the Schottky diode D3 functions as an amplitude limiter; it determines, with reference to the emitter potential of the transistor T7, the respective logic level "0" (given a blocked transistor T2) of the output pulse.

Since the logic level "0" in MOS and TTL signals approximately corresponds to 0 volts, the base of the transistor T7 must conduct the voltage $$U_B T_7 = U_D 3 + U_{BE} T_7.$$

This voltage is generated across the voltage divider R8, D2, R21; in this case, the transistor T15 is shut off, so that no current flows through the resistor R22. Only when the ECL output level is switched on, whose logic level "0" lies at −1.8 V, does the transistor T15 become conductive and a current arises through the resistor R22 and the diode D22 which correspondingly shifts the base potential of the transistor T7 into the negative. The diode D2 compensates the effect of temperature of the base-emitter voltage $U_{BE}$ of the transistor T7.

The semiconductors T10, T8 and T17 form the transmitter output stage, whereby the transistors T10 and T8 are operated in a collector configuration (emitter follower stages), i.e. effect no voltage gain.

The transistor T17 operates as a dynamically-variable constant current load for the transistor T8. Thereby, controlled by way of the collector branch of the transistor T10, a level-dependent base control voltage arises for the transistor T17, which finally varies the forward current through the output stage. Due to this measure, there occurs a bidirectional current behavior with respect to the transmitter output stage, i.e. the output stage can both emit current to a user as well as accept current. The voltage change at the base of the transistor T17, given TTL and MOS operation, derives from:

$$\Delta U_B T_{17} \approx \frac{/\Delta U_B T_{10}/}{R_{11}} \left(1 - \frac{1}{B_T 10}\right) \cdot R_{39}.$$

$B_T 10$ = Power Supply of $T_{10}$

In the ECL operating case, of course, the transistor T15 is conductive so that the resistor R36 and the diode D24 are now connected parallel to the resistor R39, for which reason a reduced base control voltage derives for the transistor T17:

$$\Delta U_B T_{17} \approx \frac{/\Delta \tau_c T_{10}/ \cdot R_{36} + /U_D 24 + U_{CE} T_{15}/}{R_{36} + R_{39}} \cdot R_{39}.$$

The diodes D10 and D11 serve as an overvoltage protection in that the diode D10 protects the transistor T8, given output-side feed of voltages of positive $U_B$ for the transistor T8 (the diode T10 blocks); the diode D11, on the other hand, protects the transistor T17, given output-side feed of voltages of negative base voltage $U_B$ for the transistor T17 (the diode D11 blocks).

The transistor T11 prevents the admissible leakage power of the transistor T17 from being exceeded given feed of positive overvoltage across the output. By way of the resistor R31, the base-emitter path of the transistor T11 lies parallel to the path D5, $U_{BE}$, T8, D10 and D11. In normal operation, therefore, three semiconductor forward voltages add up ($U_{BE}$ T8+$U_D$1-0+$U_D$11=1.7 V), in contrast to which the forward voltage of the diode D5 is again subtracted from the sum voltage, so that the transistor T11 is blocked with sufficient certainty by the remaining residual voltage ($\triangleq$ 1.2 V). In the overvoltage case, this blocking voltage is reversed (the diode D10 begins to block), in contrast to which the base voltage of the transistor T11 first remains unchanged. A current now arises across the resistor R31 since the transistor T11, of course, begins to conduct. By so doing, the transistor T16 now becomes conductive, in turn lowering the base potential, across the diode D4, of the transistor T8 toward the potential VEE. Therefore, the diode D5 also blocks, so that only the small base current of the transistor T11 now flows across the transistor T10. This current, however, causes only a minimum voltage drop ($\leq$30 mV) at the resistor R39, whereby the transistor T17 is practically blocked. This condition continues as long as the external positive overvoltage (maximum +30 V) exists at the output. Upon removal of the overvoltage, the circuit automatically returns into its original condition.

Across the resistor R37, however, the collector of the transistor T18 is also further applied to the base of the transistor T16. The base of the transistor T18 is connected by way of the resistor R38 to the programming input send-P. If the input send-P statically lies at the TTL logic level "0" ($\triangleq$ 0.4 V), then the transistor T18 is driven conductive, whereby the transistor T16 also through-connects by way of the resistor R37, which effects the same shut-down operation as in the positive overvoltage feed already described. At the same time, the Zener diode D25 triggers, which causes a base current for the transistor T21, whereby the same becomes conductive and the cathode potential of the diode D11 rises across the diode D16 toward the potential Vcc. The input "send P" thus blocks the output stage semiconductors so that only the blocking currents of the diodes D10 and D11 together with their depletion layer capacitances appear as the output impedance in this case.

In the normal operating case, the transistor T4 is held constantly conductive by way of the resistors R16 and R17. If an external, negative overvoltage ($\geq$ −5 V) occurs at the output, then the Zener diodes D8 and D9 trigger, across the base-emitter path of the transistor T12 and the diode D12. Therewith, a base current for the transistor T5 arises through the resistor R19.

The transistor T5 becomes conductive and thus blocks the transistor T4 by way of the resistor R16, the transistor T4 in turn separating, by way of the resistors R11 and R12, the output stage transistor T8 from the supply voltage Vcc.

The transistor T8 is protected against destruction by this operation given the occurrence of external, negative overvoltages ($\geq$ −5 V through −30 V). The transistor T17 is likewise protected, since the diode D11, of course, blocks in this case.

Apart from the negative overvoltage, the emitter follower stage T8 must be sufficiently protected against excess current load (for example, short circuits in the test specimen) until the response of the overvoltage limiter. The resistor R12 assumes this task. As a function of the emitter output current of the transistor T8, a current-proportional voltage drop occurs at the resistor R12 which correspondingly reduces the voltage $U_{CE}$ of the transistor T8, whereby a collector leakage power limitation for the transistor T8 derives:

$$P_C T_8 = [V_{CC} - U_E T_8 - |(I_E T_8 - I_B T_8)|R_{12}] \cdot (I_E T_8 - I_B T_8).$$

Since the signal generator in the ECL transmit case must drive terminated lines (Z=R=50Ω), as well as non-terminated lines without reflection, it is necessary to switch the inset point of the current limitation. This occurs by way of the programming input "HI-P" by means of the semiconductors T22, D7 and T9. For example, if, given selection of a non-terminated line, the input "HI-P" become activated by the application of a TTL static logic level "1" ($\triangleq$ 3.5 V), then the transistor T9 blocks and thereby disconnects the resistor R12 from the supply voltage Vcc. The transistor T8 is thus currentless and its collector side, so that it only exerts a diode function across its base-emitter path. In contrast thereto, the resistor R11 remains connected to the potential Vcc via the conductive transistor T4; in this case, the transistor T10 (emitter follower stage) is the level-determining active element, whereby the positive edge of the output current is determined in accordance with:

$$\Delta I_\uparrow = \frac{\frac{\Delta U_{ECL}}{2}}{Z}$$

only by means of the resistor R11 (constant current function with respect to the relatively small ECL level). The output current for the double delay time (2τ) given positive edge of the non-terminated ECL line accordingly amounts to:

$$I_{A\uparrow} = \frac{|V_{CC} - U_{CE}T_4 - (U_{BE}T_8 + U_D 10) + 1.2|}{R_{11}}$$

1.2 = Amount of the current voltage of the ECL level

In this case, i.e. during the double delay time of the connected line, the transistor T10 or, respectively, the diode D5 is blocked, so that no current flows through the resistor R39, thus, the transistor T17 is likewise blocked. Only after the arrival of the pulse reflected by the line does the transistor T10 and, therefore, the transistor T17 become active again, whereby a forward current arises in the output stage. The above operation is repeated in the reverse direction for the negative edge. The transistor T17 (constant current source) now supplies the reverse current according to $$\Delta I_\downarrow = \frac{\frac{\Delta U_{ECL}}{2}}{Z}$$

whereas the transistor T8 or, respectively, the diode T10 block for twice the delay time of the connected line. The transistor T8 and the diode T10 are reactivated only after arrival of the reflected pulse and a forward current again arises. The transistor T10 with its emitter follower function remains the level determinant in both cases after the expired reflection.

The diode D5 compensates at the effective temperature of the diode D10. The diode D6 protects the base-emitter path of the transistor T9 from destructive puncture given overvoltage feed at the input side $$\geq -5 \text{ V through } -30 \text{ V}.$$

In normal operation, i.e. without selection of the input "HI-P", the static output resistance amounts to:

$$R_{IA} \approx \left( \frac{|U_{CE}T_{17}|}{I_C T_{17}} + R_{41} + r_{D11} \right) \parallel \left( \frac{V_{BE}T_8 \cdot I_B T_8}{I_C T_8} + \frac{R_g}{B_T 8} + r_{D10} \right)$$

$R_g$ = generator internal resistance [or: output impedance] at the base of $T_8$.
$B_T 8$ = gain of $T_8$ The receiver is constructed as follows. The transistor stages T12 and T13 form a differential amplifier by way of the Zener diodes D12 and D13, the differential amplifier being supplied, in order to obtain a large common mode range, with constant current on its emitter side by the transistor T6. The voltage divider R17–R16, $U_{BE}$ T4 generates the base bias voltage for the transistor T6. The base-emitter voltage $U_{BE}$ of the transistor T4, thereby, has a compensating effect on the effective temperature of the base-emitter voltage of the transistor T6. There then applies to the collector current of the transistor T6:

$$I_C T_6 = \frac{\frac{V_{CC} - /U_{BE}T_4/}{R_{16} + R_{17}} \cdot R_{16} + /U_{BE}T_4/ - /U_{BE}T_6/}{R_{14}} \left(1 - \frac{1}{B_T 6}\right).$$

The transistor T5 is blocked in the normal case.

The resistors R32 and R33 serve as the collector resistors for the transistors T12 and T13, a Schottky diode D17 and a Schottky diode D18 being respectively connected parallel to the resistors R32 and R33 for the purpose of amplitude limitation. This offers the advantage that the gain, given the resistors R32 and R33 which are dimensioned sufficiently high-resistant, can be great, in contrast whereto, due to the amplitude limitation of the diodes D17 and D18 and the small collector voltage amplitudes (equivalent to 400 mV) thereby deriving, the "Miller effect" (reactive effect collector-base-capacitance is multiplied by the gain at the transistors T12 and T13) does not yet have a determining influence. Moreover, the inputs of the comparator K1 are protected from differential overdriving.

The voltage drop at the resistor R43 fixes the DC operating point for the inputs of the comparator K1. The sum collector current of the transistor T12 and the transistor T13 (equivalent collector current of the constant current source transistor T6) flows through the resistor R43.

The diodes D12 and D13 prevent the destruction of the transistors T12 and T13 given breakdown of the base-emitter path in the blocking direction. This occurs, for example, given great differential voltages between the reference voltage input $U_{vergl}$ lies at 0 volts and the base of the transistor T12 lies at +30 volts by way of the resistor R44, then the diode D12 is blocked and a destructive breakdown of the base-emitter path of the transistor T12 is prevented.

The diodes D14 and D15 protects the inputs of the comparator K1 from destructive overvoltage. If the measuring input ($\triangleq$ base of the transistor T12), for example, lies at −30 V, then the transistor T12 is fully in saturation, i.e. the collector-base diode is conductive, whereby the collector voltage of the transistor T12 assumes the value $$U_C = U_B - U_{CB}$$

i.e. approximately 29.3 V. By so doing, the diode D14 is blocked and the input 3 of the comparator K1 is sufficiently protected.

Further, given negative overvoltage feed ($\geq 5$ V through −30 V) the two Zener diodes D8 and D9 also trigger, so that a base current for the transistor T5 arises through the resistor R19. The transistor T5 becomes conductive and thus connects the base of the transistor T6 to the potential Vcc. Therefore, the transistor T6 is blocked and protected in terms of collector leakage power.

The comparator K1 evaluates the differential voltage at the resistors R32 and R33. It further contains the "actual value flip-flop" (D-flip-flop controlled by clock conditions).

If, for example, the input "Sample-P" lies statically at the ECL logic level "1" (= −0.8 V), then the comparator outputs "Out-N" change digitally in chronological analogy to the polarity of the input differential voltage. In contrast thereto, if the input "Sample-P" is connected to the ECL logic level "0" (= −1.8 V), then that information is digitally stored at the outputs which are connected to the inputs as a differential analog voltage value at the point in time of the shut-down edge. The minimum width of the sampling pulse amounts to 3ns.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A test facility for an automatic test system for function testing of integrated circuits of different technologies, each test specimen having an input and an output, comprising:
   a test pin for connection to both the input and the output of a test specimen;
   a transmitter including a constant current source including an input for receiving an input signal at a TTL level referred to zero volts and including an output, an output stage including an input connected to said output of said constant current source, including a dynamically variable constant current load which adapts said output stage to emit or receive current and including an output connected to said test pin and to said load, a programming circuit including a pair or programming inputs for receiving signal levels defining respective circuit technologies and including a plurality of resistors for connection to said constant current source and including switch means connected to said programming inputs and to said plurality of resistors and selectively operable in response to the applied signal levels to selectively connect said resistors to said constant current source to set the output level thereof to drive said output stage in accordance with the technology defined by the applied signal levels;
   a receiver including an input connected to said output of said output stage and including an output, said receiver further including comparison means connected between said receiver input and said receiver output and operable to compare the signal at said test pin with a selected reference;
   a memory connected to said output of said receiver for storing information supplied to said comparison means; and
   a bidirectional line connecting said output of said output stage and said input of said receiver to said test pin.

2. The test facility of claim 1, wherein said constant current source comprises:
   a first transistor connected as an emitter follower including a base for receiving the inverted input signal; and
   a second transistor connected to said first transistor in a common base configuration.

3. The test facility of claim 2, wherein said output stage comprises:
   a third transistor and a fourth transistor each including a base, an emitter and a collector and connected in cascade as emitter followers with an output circuit and connected to said second transistor;
   a fifth transistor operable as said dynamically variable load connected in said output circuit, a collector resistor connected to said collector of said third transistor,
   said fifth transistor including a base connected to the junction of said collector of said third transistor and said collector resistor.

4. The test facility of claim 3, wherein said programming circuit comprises:
   sixth and seventh transistors each including a base, an emitter and a collector, said collectors electrically connected to said input of said output stage and to said output of said constant current source;
   a first diode and a first ohmic resistor in series therewith connecting said collector of said sixth transistor to said output of said constant current source;
   a second diode and a second ohmic resistor in series therewith connecting said collector of said seventh transistor to said output of said constant current source;
   said emitters of said sixth and seventh transistors connected to a first potential of a first polarity;
   a third ohmic resistor connected in parallel to said first diode-first ohmic resistor-sixth transistor combination and in parallel to said second diode-second ohmic resistor-seventh transistor combination, said third ohmic resistor having a resistance value such that the ECL "log" level lies at said output of said output stage in response to a blocked state of said sixth and seventh transistors;
   a third diode, constructed as a Zener diode;
   an eighth transistor including a base, an emitter and a collector, said third diode connecting said emitter to said input of said output stage and to said output of said constant current source, said collector connected to a second potential of a second polarity;
   fourth and fifth diodes, constructed as Zener diodes, respectively connected to said bases of said sixth and seventh transistors, adopting said sixth and seventh transistors to be driven with a TTL logic level in response to said applied signal levels;
   a voltage divider, including a pair of resistors, connected to said base of said eighth transistor and connected between said second potential and a reference potential;
   a fourth ohmic resistor and a sixth diode in series therewith connected between said base of said eighth transistor and said collector of said seventh transistor;
   said first and second resistors having resistance values such that a TTL "log 1" level or an MOS "log 1" level is provided at said output of said output stage, respectively, in response to a blocked condition of said sixth transistor or, respectively, said seventh transistor.

5. The test facility of claim 4, and further comprising:
ninth and tenth transistors each including a base for receiving the applied signal levels, a collector connected to said first potential and an emitter connected, respectively, to said fourth and fifth diodes.

6. The test facility of claim 5, and further comprising:
a seventh diode connected between said resistors of said voltage divider.

7. The test facility of claim 6, and further comprising:
an eighth diode, constructed as a Zener diode, and a fifth ohmic resistor connecting said base of said fifth transistor to said collector of said seventh transistor.

8. The test facility of claim 7, and further comprising:
ninth and tenth diodes, constructed as Zener diodes, connected in series between said emitter of said fourth transistor and said collector of said fifth transistor, the junction therebetween connected to said test pin.

9. The test facility of claim 8, and further comprising:
an eleventh diode, constructed as a Zener diode, connected between said emitter of said third transistor and said base of said fourth transistor;
an eleventh transistor including a base, an emitter and a collector, said base connected to said emitter of said third transistor;
a sixth ohmic resistor connecting said collector of said eleventh transistor to said first potential;
a seventh ohmic resistor connecting said emitter of said eleventh transistor to said collector of said fifth transistor;
a twelfth transistor including a base, an emitter and a collector, said emitter and collector respectively connected to said first and second potentials and said base connected to said collector of said eleventh transistor; and
a twelfth diode, constructed as a Zener diode, connecting said collector of said twelfth transistor to said base of said fourth transistor.

10. The test facility of claim 9, and further comprising:
a thirteenth transistor including a base, an emitter and a collector;
an eighth ohmic resistor connecting said collector of said thirteenth transistor to said base of said twelfth transistor;
said emitter of said thirteenth transistor electrically connected to said second potential;
said base of said thirteenth transistor adapted to receive a static TTL level as a third programming input; and
a thirteenth diode, constructed as a Zener diode, connecting said collectors of said third and twelfth transistors.

11. The test facility of claim 10, wherein said comparison means comprises:
a comparison circuit including a differential amplifier comprising fourteenth and fifteenth transistors each including a base, an emitter and a collector, said base of said fourteenth transistor electrically connected to said test pin and said base of said fifteenth transistor connected to a comparison potential.

12. The test facility of claim 11, and further comprising:
a pair of collector circuits respectively connecting said fourteenth and fifteenth transistors to said first potential, each of said collector circuits comprising a Schottky diode and a resistor in series therewith.

13. The test facility of claim 12, and further comprising:
a common resistor connecting said resistors of said collector circuits to said first potential.

14. The test facility of claim 13, and further comprising:
nineteenth and twentieth diodes, constructed as Zener diodes in series with said resistors of said collector circuits of said fourteenth and fifteenth transistors.

15. The test facility of claim 14, and further comprising:
twenty-first and twenty-second diodes respectively connected in series with said emitters of said fourteenth and fifteenth transistors.

16. The test facility of claim 15, wherein said memory comprises:
a clock-controlled D-flip-flop connected to said comparison circuit to receive a logical ECL level as a sampling voltage.

17. The test facility of claim 16, and further comprising:
a twenty-third diode and a twenty-fourth diode constructed as Zener diodes and connected in series;
a ninth ohmic resistor connecting said twenty-first and twenty-second diodes to said twenty-third and twenty-fourth diodes; and
a tenth ohmic resistor connecting said twenty-third and twenty-fourth serially-connected diodes to said second potential.

18. The test facility of claim 17, and further comprising:
a sixteenth transistor including a base, an emitter and a collector, said emitter electrically connected to said second potential, and said collector connected to said twenty-first and twenty-second diodes; and
a further voltage divider including a tap connected to said base of said sixteenth transistor.

19. The test facility of claim 18, and further comprising:
seventeenth and eighteenth transistors each including a base, an emitter and a collector;
said emitters connected to said second potential;
said base of said seventeenth transistor connected to the reference potential via said further voltage divider and said seventeenth transistor being normally conductive;
said collector of said eighteenth transistor connected to said tap of said further voltage divider; and
said base of said eighteenth transistor connected to the junction of said tenth ohmic resistor and said twenty-third diode.

20. The test facility of claim 19, and further comprising:
an eleventh ohmic resistor connected between said collector of said fourth transistor and said collector of said seventeenth transistor.

21. The test facility of claim 20, and further comprising:
nineteenth and twentieth transistors each including a base, an emitter and a collector;
the collector-emitter path of said twentieth transistor connected between said second potential and said reference potential and said base adapted to receive a logical TTL level as a fourth programming input;
the collector-emitter path of said nineteenth transistor connected between said collector of said seventeenth transistor and said eleventh ohmic resistor; and
a twenty-fifth diode, constructed as a Zener diode, connected between said emitter of said twentieth transistor and said base of said nineteenth transistor to drive said nineteenth transistor.

* * * * *